(12) United States Patent
Drouard et al.

(10) Patent No.: US 8,648,258 B2
(45) Date of Patent: Feb. 11, 2014

(54) MECHANICAL CABLE ENTRY PORT

(75) Inventors: Patrick Drouard, Pontchateau (FR);
Yvonnick Marsac, Drefféac (FR)

(73) Assignee: 3M Innovative Properties Company,
St. Paul, MN (US)

( * ) Notice: Subject to any disclaimer, the term of this patent is extended or adjusted under 35 U.S.C. 154(b) by 358 days.

(21) Appl. No.: 13/120,024

(22) PCT Filed: Sep. 28, 2009

(86) PCT No.: PCT/US2009/058547
§ 371 (c)(1),
(2), (4) Date: Mar. 21, 2011

(87) PCT Pub. No.: WO2010/047920
PCT Pub. Date: Apr. 29, 2010

(65) Prior Publication Data
US 2011/0211326 A1  Sep. 1, 2011

Related U.S. Application Data

(60) Provisional application No. 61/107,019, filed on Oct. 21, 2008.

(51) Int. Cl.
| H01B 17/26 | (2006.01) |
| H01B 17/58 | (2006.01) |
| H02G 3/22 | (2006.01) |
| H01L 23/49 | (2006.01) |
| H01R 9/05 | (2006.01) |
| H02G 15/04 | (2006.01) |
| H02G 15/013 | (2006.01) |
| H02G 15/02 | (2006.01) |
| H02G 15/08 | (2006.01) |

(52) U.S. Cl.
USPC ....... 174/152 G; 174/656; 174/657; 174/658; 174/75 R; 174/74 R

(58) Field of Classification Search
USPC .......... 174/152 G, 656, 657, 658, 70 R, 74 R, 174/75 R; 248/56; 385/134, 135
See application file for complete search history.

(56) References Cited

U.S. PATENT DOCUMENTS 5,426,715 A   6/1995  Moisson et al.
5,510,576 A   4/1996  Tenace et al.
(Continued)

FOREIGN PATENT DOCUMENTS

AU   626429 B2   7/1992
EP   0 767 522 A1   4/1997
(Continued)

OTHER PUBLICATIONS

China Search Report, mailed on May 29, 2013, 1 p.

Primary Examiner — Hoa C Nguyen
Assistant Examiner — Binh Tran
(74) Attorney, Agent, or Firm — Janet A. Kling

(57) ABSTRACT

A port entry device (100) is described for inserting a telecommunication cable (60) containing optical fibers into a telecommunications enclosure (300). In particular, the port entry device (100) is an oval port sealing device. The port entry device includes a tubular housing (110), a split sleeve (130) and a pair of clamping nuts (120). The tubular housing has an interior passageway (113) between a first end (110a) of the housing and a second end (110b) of the housing. The interior passageway can include a first cable channel (111) and a second cable channel (112). The housing can have an elliptical cross section. The split sleeve (130) positions the telecommunication cable (60) within the port entry device (100) when the split sleeve (130) is inserted into the interior passageway (113) of the housing (110). The clamping nuts are attachable to the second end (110b) of the housing to secure the split sleeve (130) within the housing (110).

12 Claims, 10 Drawing Sheets

(56) References Cited

U.S. PATENT DOCUMENTS

| | | | |
|---|---|---|---|
| 5,545,854 A * | 8/1996 | Ishida | 174/153 G |
| 5,700,012 A | 12/1997 | Froehlich et al. | |
| 5,732,180 A | 3/1998 | Kaplan | |
| 6,184,467 B1 | 2/2001 | Milanowski et al. | |
| 6,269,214 B1 | 7/2001 | Naudin et al. | |
| 6,768,859 B2 * | 7/2004 | Milanowski et al. | 385/134 |
| 7,582,831 B2 * | 9/2009 | Kiely et al. | 174/84 R |
| 2009/0060421 A1 | 3/2009 | Parikh et al. | |

FOREIGN PATENT DOCUMENTS

| | | |
|---|---|---|
| EP | 0 942 506 A1 | 9/1999 |
| EP | 1 261 094 A1 | 11/2002 |
| WO | WO 00/72072 A1 | 11/2000 |
| WO | WO 2009/067311 A1 | 5/2009 |
| WO | WO 2009/126411 A1 | 10/2009 |
| WO | WO 2010/008718 A2 | 1/2010 |

* cited by examiner

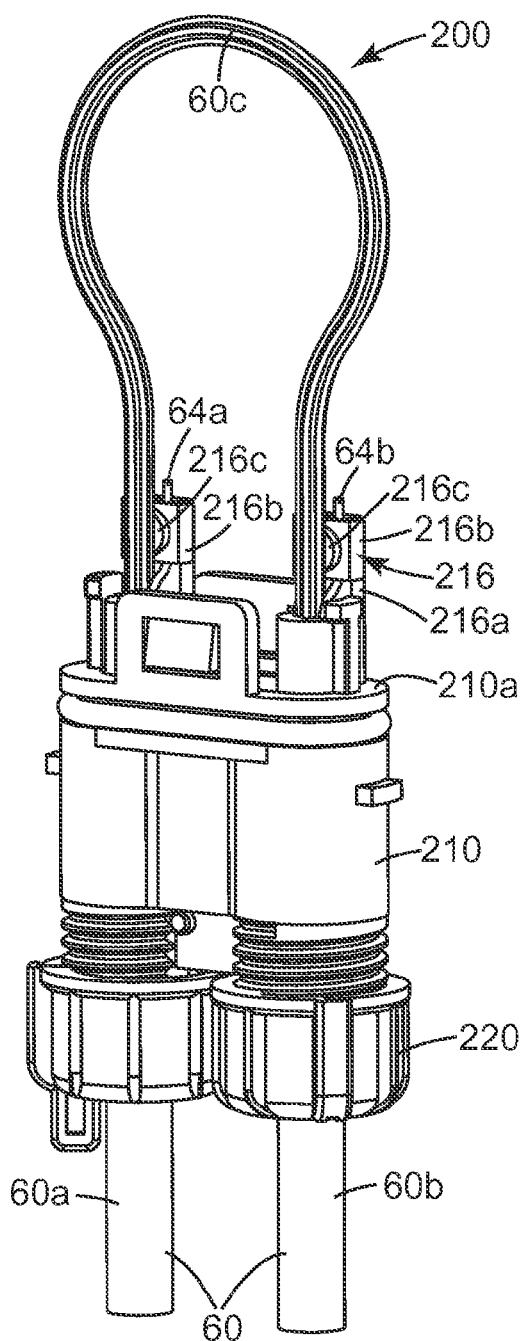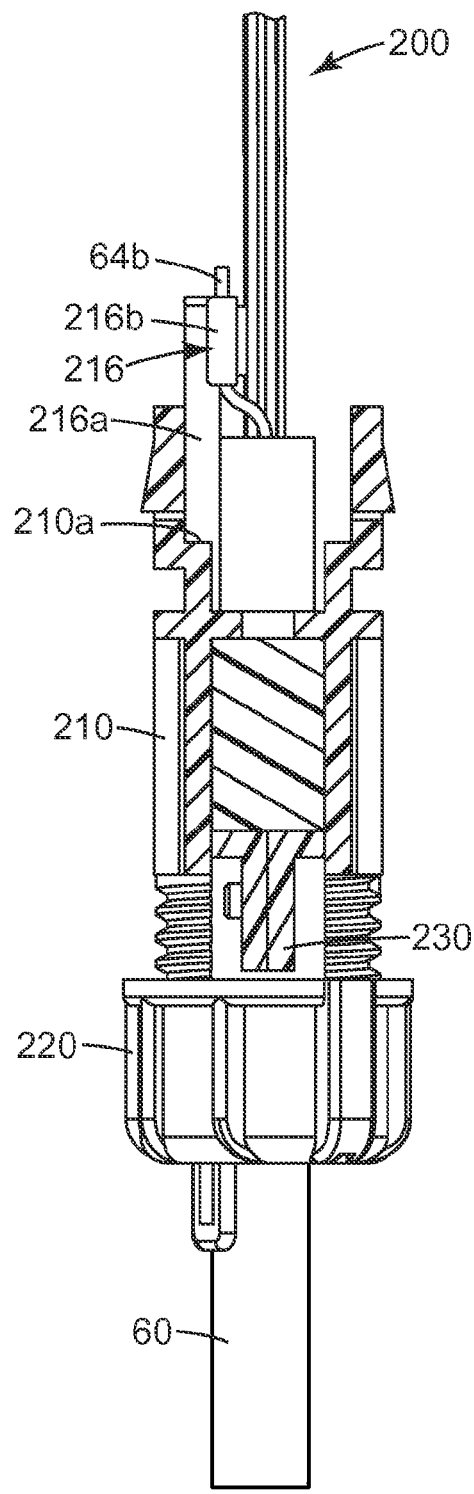
Fig. 8A
Fig. 8B

MECHANICAL CABLE ENTRY PORT

CROSS REFERENCE TO RELATED APPLICATIONS

This application is a national stage filing under 35 U.S.C. 371 of PCT/US2009/058547, filed Sep. 28, 2009, which claims priority to U.S. Provisional Application No. 61/107019, filed Oct. 21, 2008, the disclosure of which is incorporated by reference in its/their entirety herein.

FIELD OF THE INVENTION

The present invention relates to a mechanical cable port entry device. In particular, this invention relates to an oval port entry device. The entry device is used to insert a loop or plurality of telecommunication cables containing optical fibers and/or electrical conductors into a telecommunication's enclosure, e.g. into a terminal closure, pre-stubbed terminal, optical network terminal, a fiber distribution hub, or other junction box.

BACKGROUND OF THE INVENTION

Telecommunication cables are ubiquitous and used for distributing all manner of data across vast networks. The majority of cables are electrically conductive cables (typically copper), although the use of optical fiber cable is growing rapidly in telecommunication systems as larger and larger amounts of data are transmitted. Additionally, as data transmissions increase, the fiber optic network is being extended closer to the end user which can be a premise, business, or a private residence.

As telecommunication cables are routed across data networks, it is necessary to periodically open the cable so that one or more telecommunication lines therein may be spliced, thereby allowing data to be distributed to other cables or "branches" of the telecommunication network. At each point where a telecommunication cable is opened, it is necessary to provide a telecommunications enclosure to protect the exposed interior of the cable. The cable branches may be further distributed until the network reaches individual homes, businesses, offices, and so on. These networks are often referred to as fiber to the premises (FTTP) or fiber to the home (FTTH) networks.

In some network installations, a telecommunication cable may pass through a telecommunication enclosure in which a portion of the communication lines within the cable are uncut. In butt-style enclosures, an uncut telecommunication cable must enter and leave through a single port. An oval port structure is known to be used for this purpose. Improved methods of providing a reliable seal around two portions of an uncut cable in a single oval port are needed. Mastics and split grommet sealing devices are frequently used to seal ports of telecommunication enclosures where a portion of the lines must be accessed mid-span. Mastics can be messy and difficult to use in the field.

SUMMARY OF THE INVENTION

Exemplary embodiments herein provide a port entry device for the insertion of a telecommunication cable into a telecommunication enclosure. In particular, the port entry device is an oval port sealing device. The port entry device includes a tubular housing, a split sleeve and a pair of clamping nuts. The tubular housing has an interior passageway between a first end of the housing and a second end of the housing, wherein the interior passageway includes a first cable channel and a second cable channel. The housing can have an elliptical cross section. The split sleeve positions the telecommunication cable within the port entry device when the split sleeve is inserted into the interior passageway of the housing. The clamping nuts are attachable to the second end of the housing to secure the split sleeve within the housing.

The port entry device can further include an internal sealing member disposed in the interior passageway of the housing between the split sleeve and the first end of the housing. The internal sealing member may be compressed around the communication cable passing through it when the clamping nuts are secured to the second end of the housing.

In an alternative aspect of the invention, the port entry device can include a housing having a strength member securing device attached to the first end of the housing and a pair of clamping nuts which are attachable to the second end of the housing. The clamping nuts secure the split sleeve within the port entry device housing. The strength member securing device is configured to securely grasp the strength members of the telecommunication cable passing through the port entry device.

In an alternative aspect of the invention, the port entry device may be fitted on a mid-span loop section of telecommunication cable, in particular an optical fiber cable. A length of the cable jacket can be removed from a central section of the optical fiber cable to expose the strength members and the buffer tubes containing the optical fibers. The length of cable may be bent to form a loop. The internal sealing member may be attached to the end portions of optical fiber cable loop. The loop of optical fiber cable and the internal sealing member can be inserted into the interior passageway of tubular housing such that one end portion of the loop section is disposed within a first cable channel in the interior passageway and one end portion of the loop section is disposed within a second cable channel in the interior passageway and until the internal sealing member can be seated against stops disposed within the interior passageway. The split sleeve can be fitted to end portions of the loop section of the optical fiber cable. The split sleeve can be slid into the internal passage way of the tubular housing behind the internal sealing member. The nut portions of each clamping nut are fitted together around an end portion of the loop of optical fiber cable, and the assembled clamping nut can then be secured to the tubular housing to compress the internal sealing member around the end portion of the loop section.

The port entry device may be inserted into a port of a telecommunication enclosure to provide an environmental seal. The port entry device can provide a watertight or water resistant seal and/or prevent dust, bugs or any other foreign substance from entering the telecommunication enclosure.

BRIEF DESCRIPTION OF THE DRAWINGS

The present invention will be further described with reference to the accompanying drawings, wherein:

FIGS. 8A and 8B show an alternative embodiment of a port entry device according the present invention.

Figure 1:
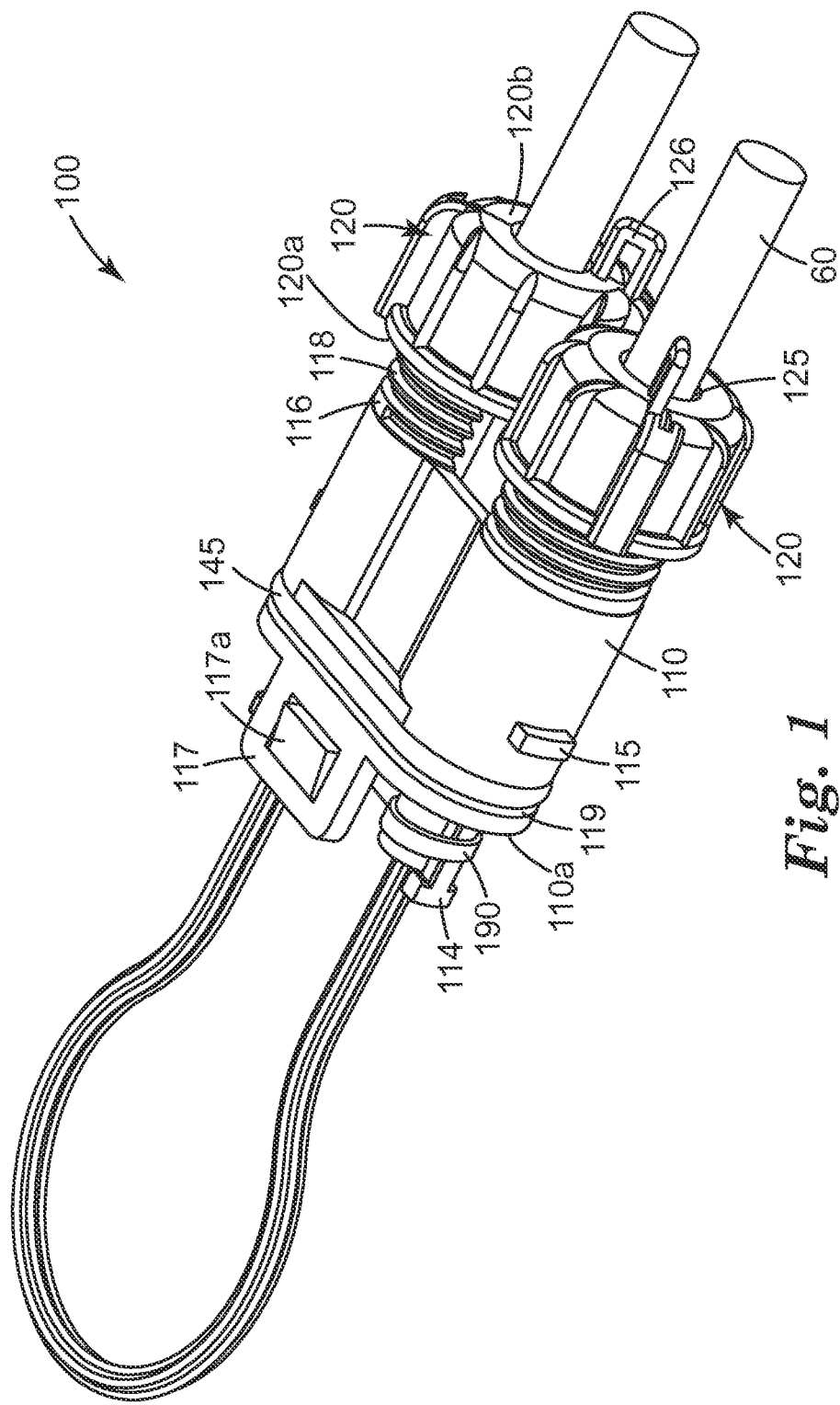
FIG. 1 shows an isometric view of a port entry device according to an embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention as defined by the appended claims.

DETAILED DESCRIPTION OF THE DRAWINGS

In the following detailed description of the preferred embodiments, reference is made to the accompanying drawings, which form a part hereof, and in which is shown by way of illustration specific embodiments in which the invention may be practiced. The illustrated embodiments are not intended to be exhaustive of all embodiments according to the invention. It is to be understood that other embodiments may be utilized and structural or logical changes may be made without departing from the scope of the present invention. The following detailed description, therefore, is not to be taken in a limiting sense, and the scope of the present invention is defined by the appended claims.

Exemplary embodiments herein provide a port entry device for the insertion of a telecommunication cable into a telecommunication enclosure; in particular the port entry device can be an oval port sealing device. By providing an environmental seal, the port entry device can be designed to provide a watertight or water resistant seal and/or to prevent dust, bugs or any other foreign substance from entering the telecommunication enclosure.

The exemplary port entry device may be fitted on to a telecommunication cable, such as an optical fiber cable, and inserted into a port in a telecommunication enclosure to secure the telecommunication cable in the port. The optical fiber cable will contain one or more optical fibers. In some cables, the optical fibers may be grouped together in fiber ribbons or protective tubes. Each optical fiber will have a polymeric coating that surrounds and protects the central glass fiber. The strength members are generally in the form of at least one semi-rigid rod of compacted aramid fibers. If more than one of these semi-rigid strength members is present in the multi-fiber cable, they may be positioned around the optical fiber ribbon cable or the protective tubes. Alternatively the multi-fiber cable may have a combination of a semi-rigid central strength member and a plurality of loose or woven flexible strength members surrounding the optical fiber ribbon cable or the protective tubes. A cable jacket surrounds and protects the optical fibers and the strength members.

Alternatively, the telecommunication cable may be an electrically conductive cable having a plurality of twisted pair copper wires, coax cables or other electrically conductive cables which are typically found in telecommunication networks. In yet another aspect of the invention, the telecommunication cable may be a hybrid cable containing both optical fibers and electrical conductors.

Depending on the communication network architecture, the telecommunication enclosure may be a buried closure, an aerial closure or terminal, a fiber distribution hub, or an optical network terminal in the outside plant; or a wall mount communication box, terminal, fiber distribution hub, a wall mount patch panel, or an optical network terminal in premise applications.

Figure 2:
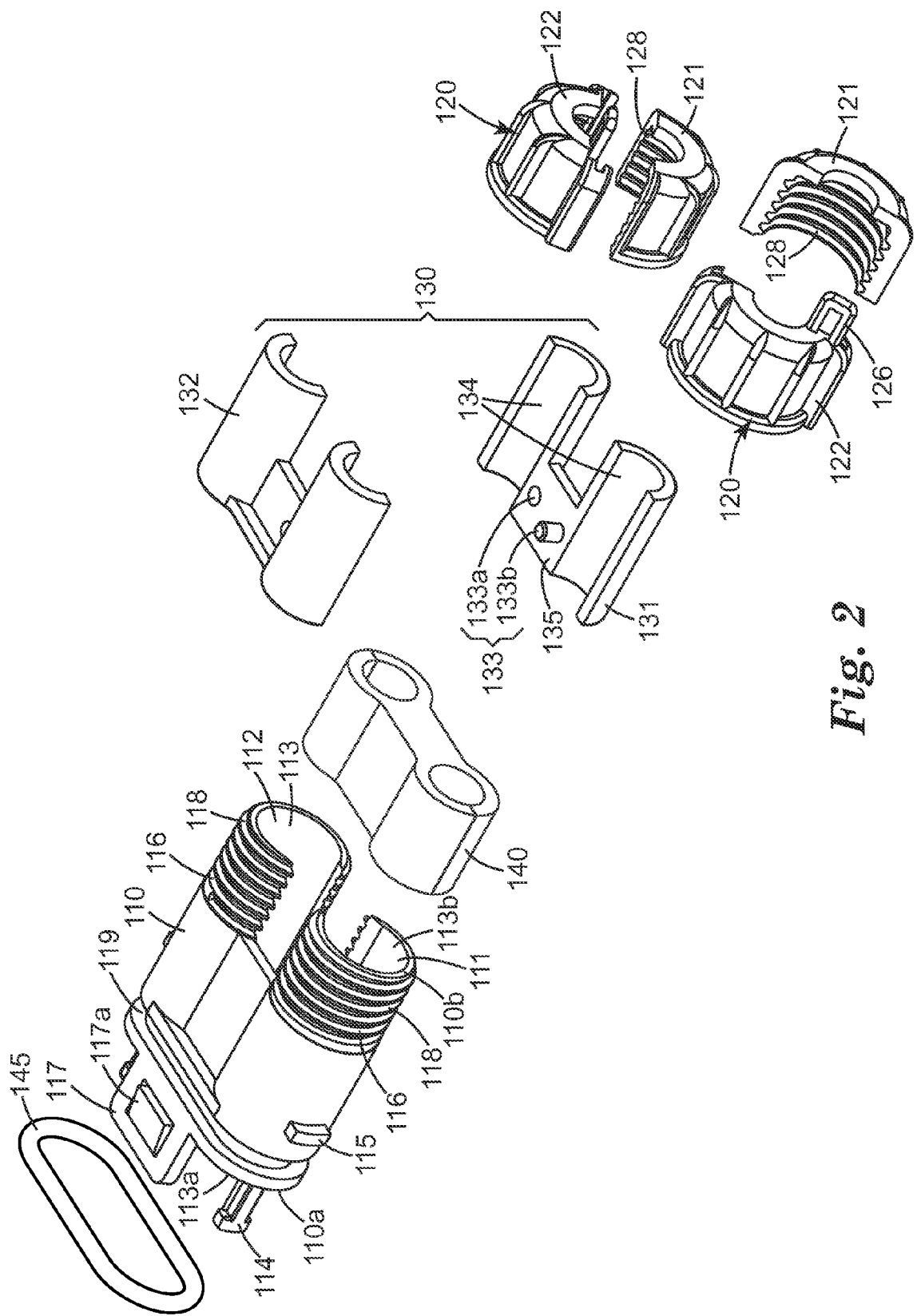
FIG. 2 shows an exploded view of a port entry device of FIG. 1.

Referring to FIGS. 1 and 2, an exemplary port entry device 100 includes a housing 110 having a first end 110*a* and a second end 110*b*, and a pair of clamping nuts 120 attachable to the second end 110*b* of the housing. The clamping nut 120 can secure a split sleeve 130 within the port entry device housing 110. The port entry device 100 may be formed of plastic by conventional methods, for example by injection molding.

The housing 110 can be generally tubular in shape having an elliptical cross section. The housing includes an interior passageway 113 that extends along the length of the housing from the first end 110*a* to the second end 110*b* of the housing. The housing includes a passage entry 113*a* at the first end 110*a* of the interior passageway 113 and a passage exit 113*b* at the second end 110*b* of the interior passageway 113. The interior passageway 113 may be configured to accommodate a plurality of certain categories of telecommunication cables including single fiber cables or multi-fiber cables, low pair count copper cables, coaxial cables or electrical/optical hybrid cables. For example in the exemplary embodiment shown in FIG. 2, the interior passageway includes a first cable channel 111 and a second cable channel 112.

The housing 110 includes a pair of resilient arms 117 located on opposing sides of the housing near the first end 110*a* of the housing. At the end of each of the arms 117 can be a latch structure 117*a*. The latch structure engages with the edge 326*a* (FIG. 4C) of port 326 in telecommunication enclosure 300 to securely retain the port entry device 100 when fully inserted. When the port entry device is inserted into the port of a telecommunication enclosure, proper positioning can be confirmed by an auditable click as the latch structures 117*a* engage with the edges of port. To remove the port entry device 100, the latch structures 117*a* may be pressed inward toward the centerline of the housing 110 until the port entry device slips out of the port.

Additionally, the housing 110 can include at least one strain relief bracket 114 on the first end 110*a* of the housing. A cable tie 190 may be secured around the cable 60 or each portion of the cable and the strain relief bracket(s) 114 to provide strain relief to the telecommunication cable.

A groove 119 (FIG. 1) may be located between the first end 110*a* and the second end 110*b* of housing 110 to receive an external sealing member 145 such as an o-ring. This external sealing member 145 can provide an environmental seal between the port entry device 100 and a port of a telecommunication enclosure when the port entry device is fully seated therein.

The housing 110 includes a pair of leg portions 116 at the second end 110*b* of the housing. Each leg has a slot on an inside portion thereof so that the elliptical interior passageway 113 is maintained along the length of the housing.

The housing 110 can have an external threaded portion 118 located on leg portion 116 at the second end 110*b* of the housing 110. The external threaded portion 118 cooperates with a corresponding internal threaded portion 128 of clamping nut 120 to secure the split sleeve 130 within housing 110. The tightening of the clamping nut 120 pushes the split sleeve 130 deeper into housing 110 compressing internal sealing member 140 around the communication cable 60. In some applications such as in premise installations, a lesser degree of environmental protection is required and the internal sealing member 140 may be omitted.

Figure 5A:
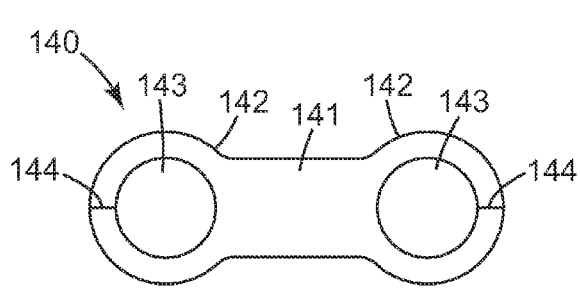
FIGS. 5A and 5B show different embodiments of internal sealing members used in the port entry device according to the invention.
Figure 5B:
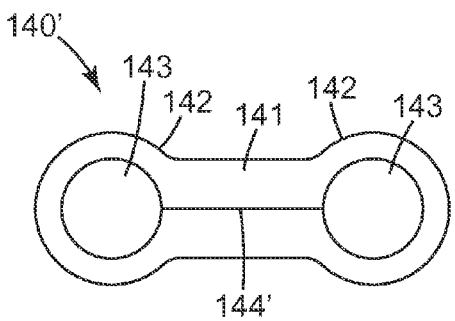

Two exemplary embodiments of internal sealing members 140, 140' are shown in FIGS. 5A and 5B. The internal sealing members have a shape that corresponds to the cross-section of the interior passageway of the tubular housing. Internal sealing member 140 can have a generally barbell shape including a central bar portion 141 which interconnects two lobe portions 142 on opposite ends of the bar portion. Each lobe portion has a cable bore 143 extending there through to accommodate the passage of a telecommunication cable. In instances where internal sealing member 140 can be used in conjunction with a mid-span loop section of a telecommunication cable, each lobe 142 can include a slit 144 to allow insertion of one side of the loop section of telecommunication cable to be inserted into each respective cable bore 143. FIG. 5B shows an alternative internal sealing member 140' in which the loop section of the telecommunication cable can be inserted through a central slit 144' in the bar portion 141 of the internal sealing member that extends between the cable bores 143 located in each lobe 142 of the internal sealing member.

In an alternative embodiment, a plurality of thinner internal sealing members may be used in place of internal sealing member 140 shown in FIG. 2. In this case it may be advantageous to use at least one internal sealing member 140 having side slits as shown in FIG. 5A in conjunction with at least one internal sealing member 140' having a central as shown in FIG. 5B to improve the sealing capability of the port entry device.

Figure 6A:
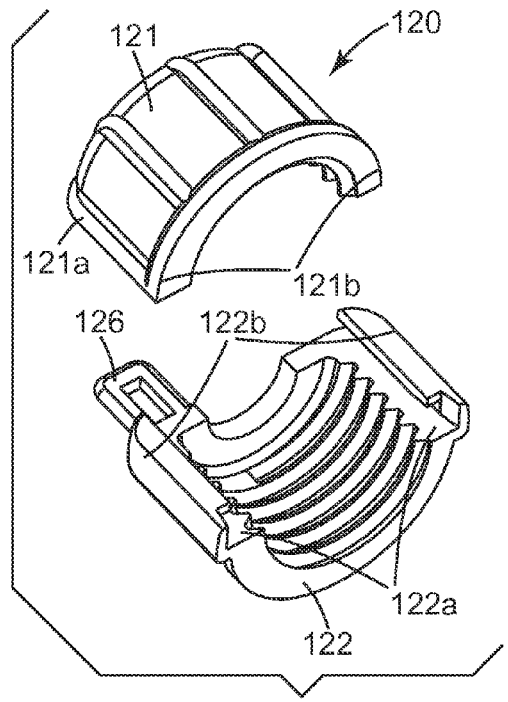
FIGS. 6A-6C show detailed views of exemplary clamping nuts.
Figure 6B:
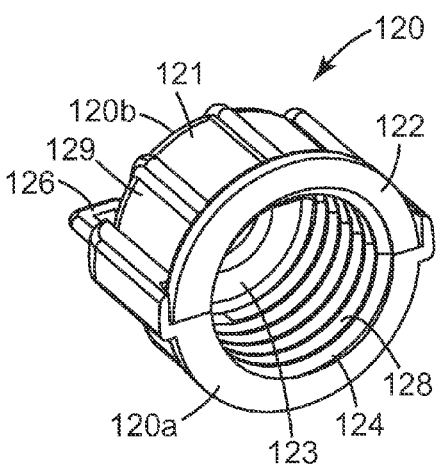

The cable clamping nut 120, shown in detail in FIGS. 6A and 6B, has an interior chamber 123 extending between the first side 120a and a second side 120b of the clamping nut. The interior chamber has a first opening 124 at the first side 120a to accept one of the leg portions on the second end 110b of housing 110. The interior chamber has a smaller second opening 125 (FIG. 1) at the second side 120b of the clamping nut 120 to accommodate the passage of a telecommunication cable 60 therethrough. The interior chamber has an internal threaded portion 128 that corresponds to and can be engagable with the external threaded portion 118 on the housing 110 to allow the cable clamping nut 120 to be secured to the housing.

Clamping nut 120 includes a pair of nut portions 121, 122. The nut portions 121, 122 are unique and keyed to fit together so that continuous internal threads 128 are defined within a central axial opening of the clamping nut to engage external threaded portion 118 on the leg portion 116 of housing 110. First nut portion 121 can include a pair of ridges 121a on each of the opposing edges 121b. The second nut portion 122 can include a pair of mating slots 122a on each of the opposing edges 122b. The mating of ridges 121a and slots 122a forms clamping nut 120 which when together may be threadably mated with external threaded portion 118 on the leg portion 116 of housing 110. Clamping nut 120 securely positions split sleeve within the housing 110 which compresses internal sealing member 140 within the housing's interior passageway 113.

Alternatively, the nut portions 121, 122 may be hermaphroditic having a ridge on one of the opposing edges and a slot on the opposite opposing edge. This design has an advantage that fewer different parts need to be molded thus simplifying manufacture. In another alternative clamping nut, the nut portions may be secured by interference fit (e.g. post and hole) or by a latching mechanism located on the opposing edges of the nut portions.

Additionally, at least one of the nut portions 121, 122 can have a loop 126 extending from the second side 120b of the nut portion. A cable tie 195 (FIG. 3G) can be inserted through loop 126 on the second side of clamping nut 120 once the nut has been tightened onto the housing 110 of the port entry device 100 and secured around the telecommunication cable (for example, an optical fiber cable 60') to keep the clamping nut 120 securely in place.

Figure 6C:
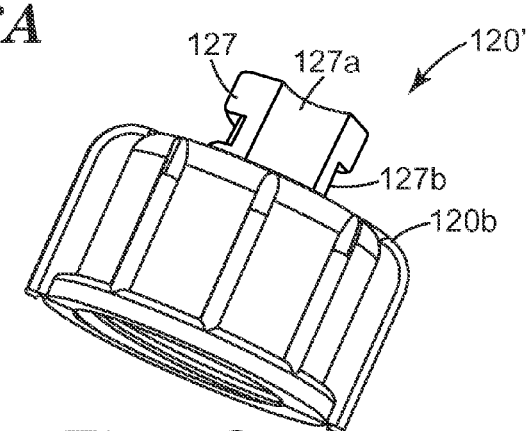

An alternative clamping nut 120' is shown in FIG. 6C. The basic structure of cable clamping nut 120' is similar to that of clamping nut 120 shown in FIG. 6B. However, cable clamping nut 120' includes a strain relief bracket 127 extending from the second side 120b of at least one of the nut portions. The strain relief bracket 127 can have a concave shaped inner surface 127a that generally conforms to and cradles a telecommunication cable when it is installed in the port entry device. Additionally, strain relief bracket 127 can have a plurality of notches 127b or a channel in its external surface to accommodate a cable tie (not shown) which is used to secure the telecommunication cable to the clamping nut 120'.

Other alternative forms of cable clamping nuts are described in PCT Patent Application No. PCT/US2009/037336, which is incorporated by reference herein in its entirety. Optionally, the clamping nut may include a cable sizing insert (not shown) which can be placed around the telecommunication cable and inserted into the clamping nut prior to attaching the clamping nut to the second end of the housing to allow the cable clamping nut to accommodate a wider range of cable diameters.

In an exemplary embodiment, clamping nut 120 can have a gripping surface 129 on the external surface of the clamping nut that corresponds to the position of the internal threaded portion 128. The clamping nut may be generally round, rectangular hexagonal or other polygonal shape. Additionally, the gripping surface may be textured (e.g. a ridged or cross-hatched texture) to further facilitate gripping of the clamping nut.

In an exemplary embodiment, the split sleeve 130 comprises a pair of shell members 131, 132 which may be secured to each other around a telecommunication cable. The shell members 131, 132 may be separate pieces as shown in FIG. 2, or may be two portions of single piece joined by a living hinge. Each of the shell members 131, 132 can have a pair of troughs 134 for receiving a telecommunication cable separated by a land area 135 disposed between the troughs 134 to ensure proper spacing between the telecommunications cables. In an alternative embodiment, the shell members may have additional troughs and land areas in order to accommodate additional telecommunication cables.

The shell members 131, 132 may have one or more alignment structures 133 located on the land area 135 to ensure proper positioning of the shell members with respect to one another. In an exemplary embodiment as shown in FIG. 2, the alignment structures 133 can be a hole 133a and post 133b on a first shell member 131 that can be mated with a corresponding post and hole structure on the second shell member 132. In an alternative embodiment, the alignment structures may secure the shell members together, for example by an interference fit or a mechanical fastener. Alternatively, an adhesive may be used to bond the shell members together.

The port entry device 100, including the housing 110, clamping nuts 120 and split sleeve 130, may be formed of any suitable plastic material. In one embodiment, the housing, clamping nuts, and split sleeve are formed of polymeric materials by methods such as injection molding, extrusion, casting, machining, and the like. For example, these parts may be made of molded polypropylene, nylon, polypropylene/nylon alloys or glass filled versions of these polymers. Material selection will depend upon factors including, but not limited to, chemical exposure conditions, environmental exposure conditions including temperature and humidity conditions, UV exposure conditions, flame-retardancy requirements, material strength, and rigidity, to name a few.

Figure 4A:
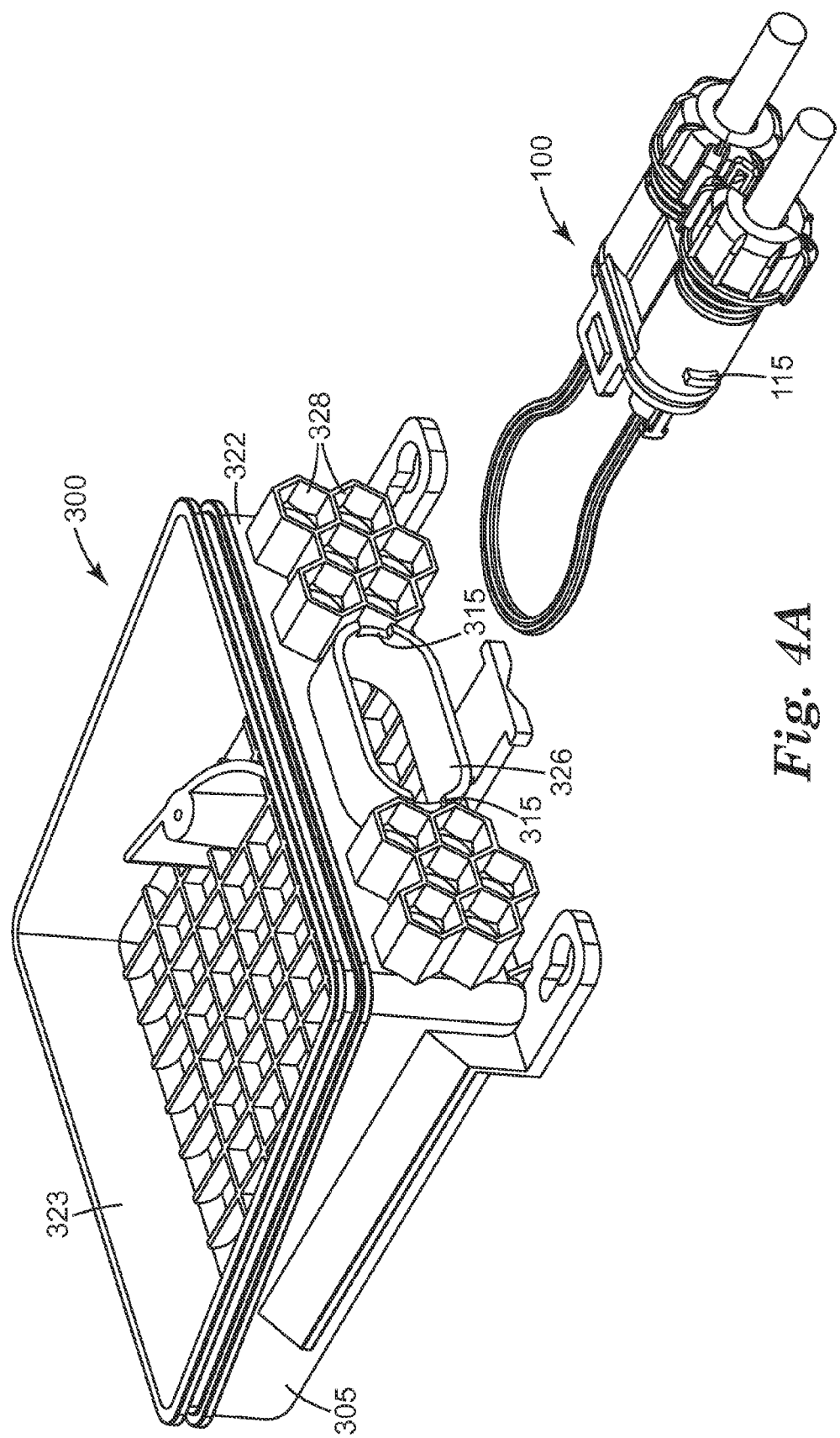
FIGS. 4A-4C show the insertion of the port entry device into the port of a telecommunication enclosure according to an embodiment of the present invention.
Figure 4B:
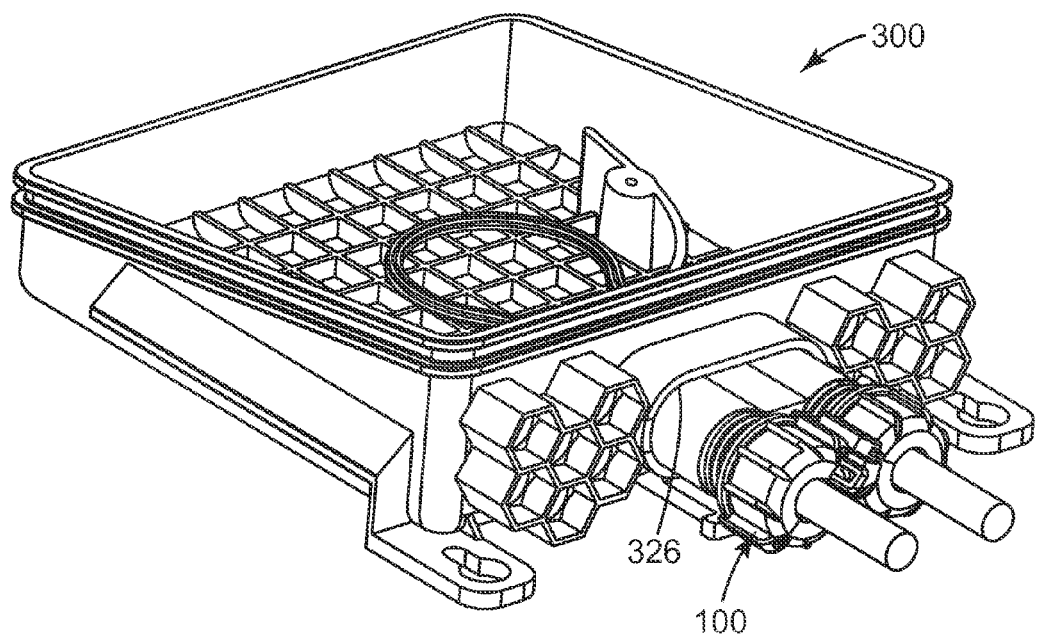
Figure 4C:
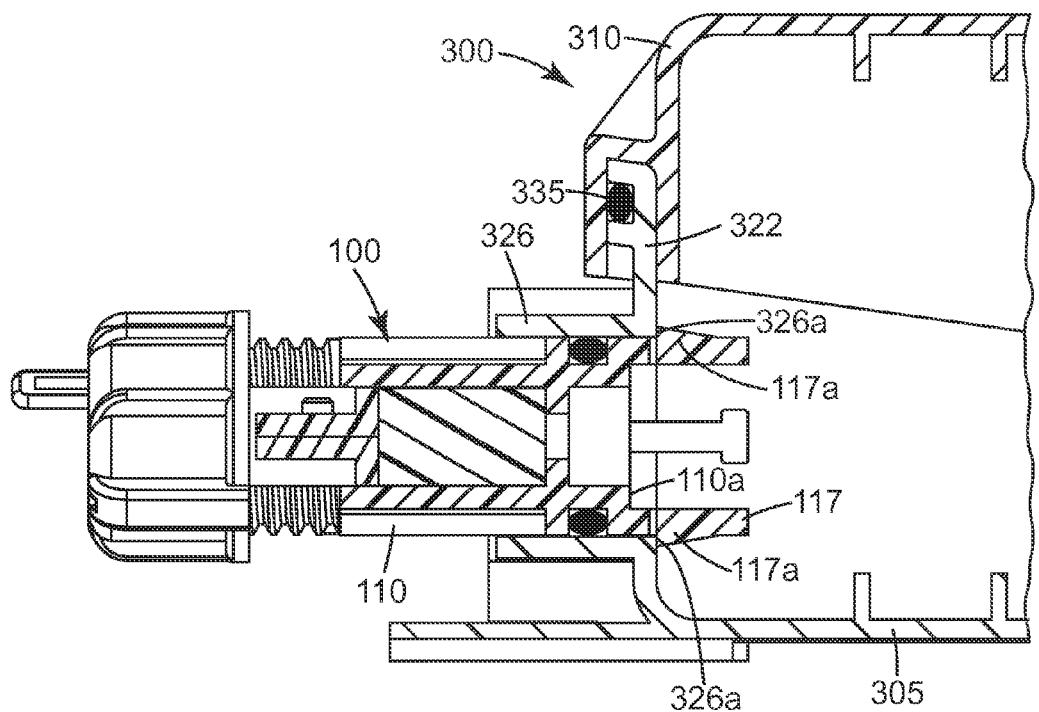

Referring to FIGS. 4B and 4C, the first end 110a of the housing 110 will reside inside the telecommunication enclosure 300 when the port entry device 100 has been fully inserted into a port 326 of a telecommunication enclosure. The second end 110b of the housing may extend completely through the port of the telecommunication enclosure when the port entry device has been fully inserted into a port of a telecommunication enclosure, as shown. Alternatively, the second end of the housing may be located within the port of the telecommunication enclosure when the port entry device has been fully inserted into a port of a telecommunication enclosure.

The housing 110 includes a pair of resilient arms 117 located on opposing sides of the housing near the first end 110a of the housing. At the end of each of the arms 117 can be a latch structure 117a. The latch structure engages with the edge 326a of port 326 in telecommunication enclosure 300 to retain port entry device 100 securely in the port when fully inserted. When the port entry device 100 is inserted into the port 326 of a telecommunication enclosure 300, proper positioning can be confirmed by an auditable click as the latch structures 117a engage with the edges 326a of port 326. To remove the port entry device 100, the latch structures 117a may be pressed inward toward the centerline of the housing 110 until the port entry device slips out of the port 326.

An alternative embodiment of an exemplary port entry device 200 is shown in FIGS. 8A and 8B. Port entry device 200 includes a housing 210 having a first end 210a and a second end (not shown), and a pair of clamping nuts 220 attachable to the second end of the housing as shown in FIGS. 8A and 8B. The clamping nuts 220 secure a split sleeve 230 within the port entry device housing 210. The split sleeve and clamping nuts are similar to those described previously. The port entry device 200 may be formed of plastic by conventional methods, for example by injection molding.

Figure 7A:
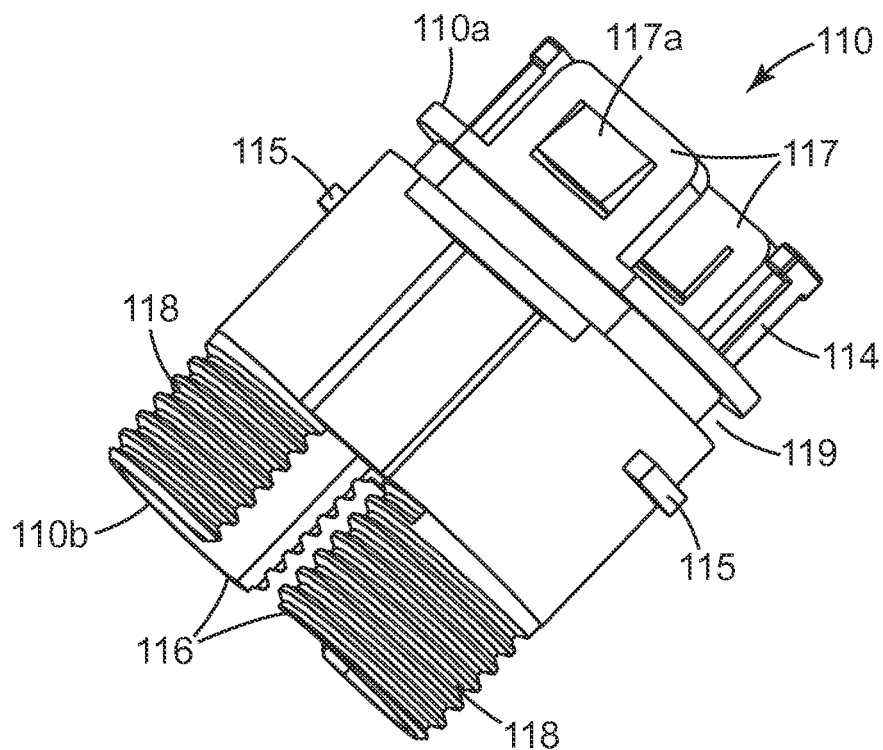
FIGS. 7A and 7B show a detailed view of the housing of the port entry device according to an embodiment of the present invention.

Housing 210 is similar to housing 110 shown in FIG. 7A with the addition of strength member securing device 216 disposed on the first end 210a of the housing. The strength member securing device includes an extension 216a attached to the first end 210a of housing 210 that extends away from the housing generally parallel to the interior passageway 213. At the end of the extension opposite the housing is a clip 216b that is configured to securely grasp the strength member(s) 64a, 64b of the telecommunication cable 60, such as an optical fiber cable. Clip 216b may be secured to extension 216a by a mechanical fastener 216c, as shown in FIG. 8A; interference fit; another mechanical interlocking method; or by an adhesive.

In the exemplary shown in FIG. 8A, the housing includes two strength member securing devices 216. One of the strength member securing devices may be attached to strength member 64a of end portion 60a of the optical fiber cable loop and the second strength member securing device may be attached to strength member 64b of end portion 60b of the optical fiber cable loop.

FIGS. 3A-3G show the installation of an exemplary port entry device 100 onto a loop of telecommunication cable 60'. For example, the exemplary port entry device may be fitted onto an optical fiber cable. The optical fiber cable will contain one or more optical fibers. Each optical fiber will have a polymeric coating that surrounds and protects the central glass fiber. In multi-fiber cables the optical fibers may be assembled into one or more buffer tubes 62 or ribbon cables. Additionally, the optical fiber cable may have one or more strength members. A cable jacket 61 surrounds and protects the optical fibers and the strength members.

Figure 3A:
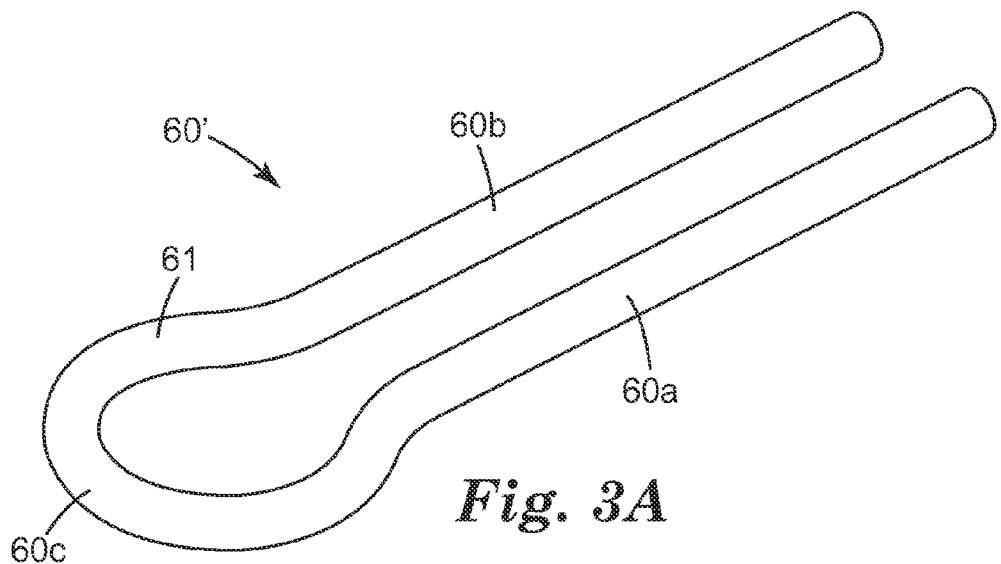
FIGS. 3A-3G show the assembly of a port entry device according to an embodiment of the present invention.
Figure 3B:
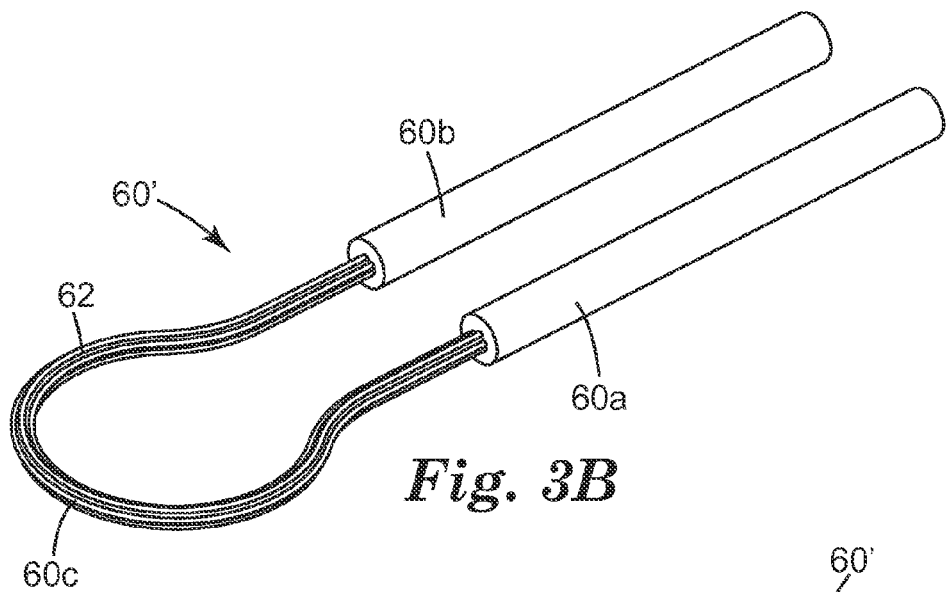
Figure 3C:
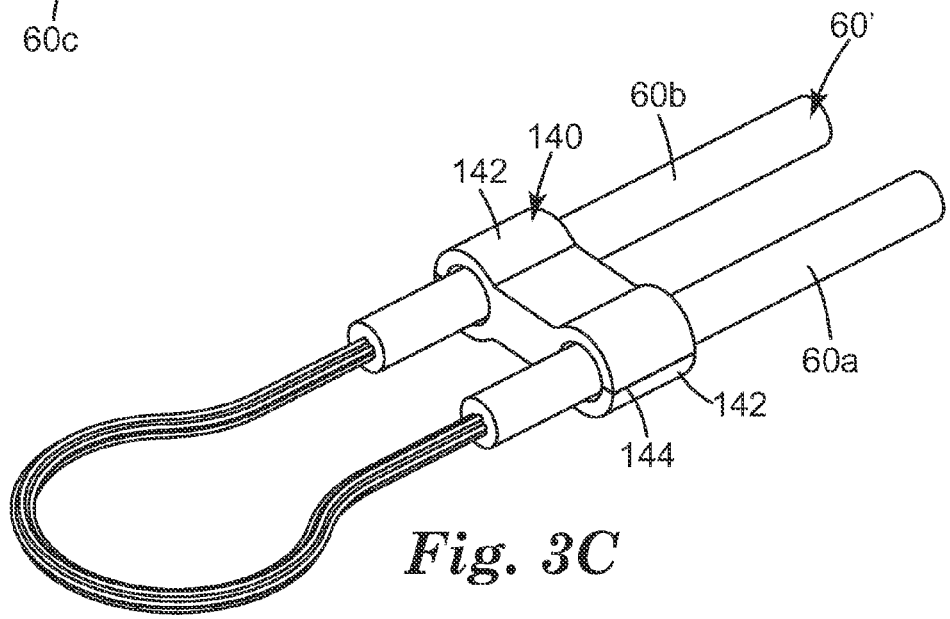

As shown in FIG. 3A, the optical fiber cable 60' includes two end portions 60a, 60b disposed on either side of a central loop portion 60c. A length of the cable jacket 61 can be removed from a central loop portion 60c of optical fiber cable 60' as shown in FIG. 3B to expose the strength members (not shown) and the buffer tubes 62 containing the optical fibers. The internal sealing member 140 may be attached to the optical fiber cable loop as shown in FIG. 3C. Each end portion 60a, 60b of optical fiber cable 60' can be inserted through slit 144 into each respective cable bore in each lobe 142 of the internal sealing member 140.

Figure 7B:
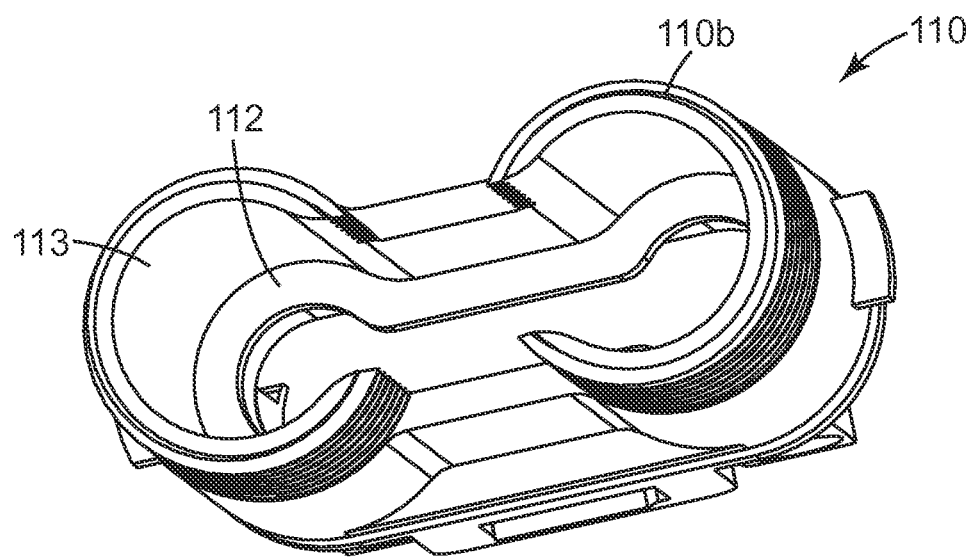

Next, the loop of optical fiber cable and the internal sealing member 140 are inserted into the interior passageway 113 of housing 110 until the internal sealing member is seated against stops 112 (FIG. 7B) within the interior passageway of the housing. The loop section of cable is inserted into the interior passageway of the housing such that one end portion of the loop section is disposed within a first cable channel in the interior passageway and one end portion of the loop section is disposed within a second cable channel in the interior passageway.

Figure 3D:
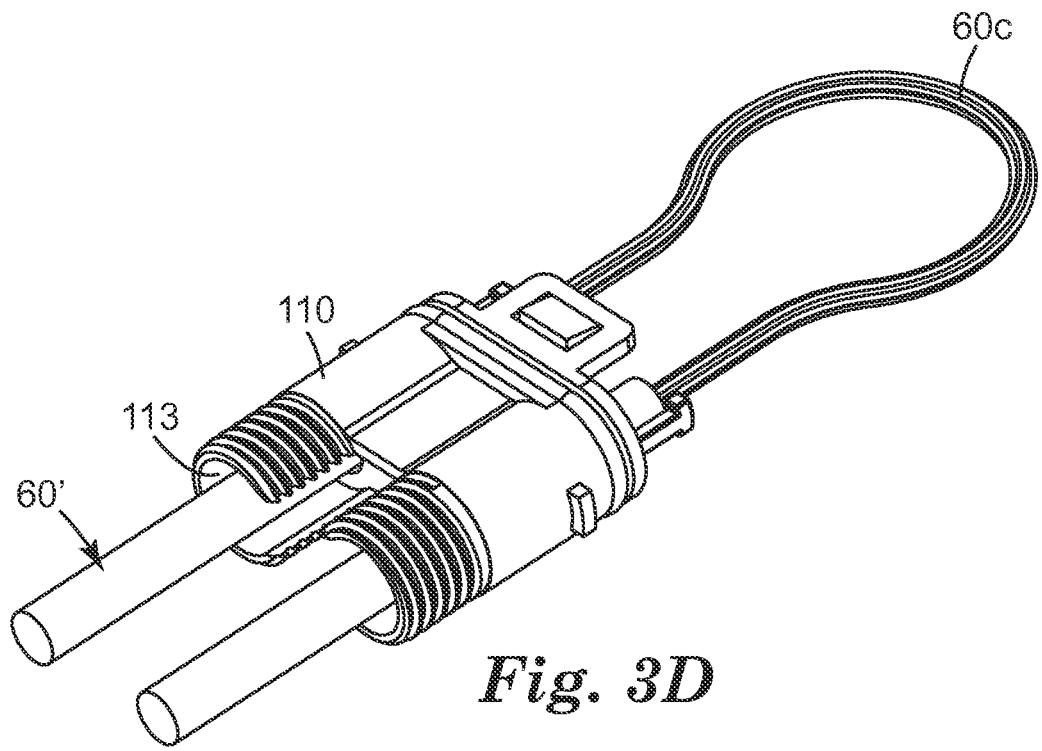
Figure 3E:
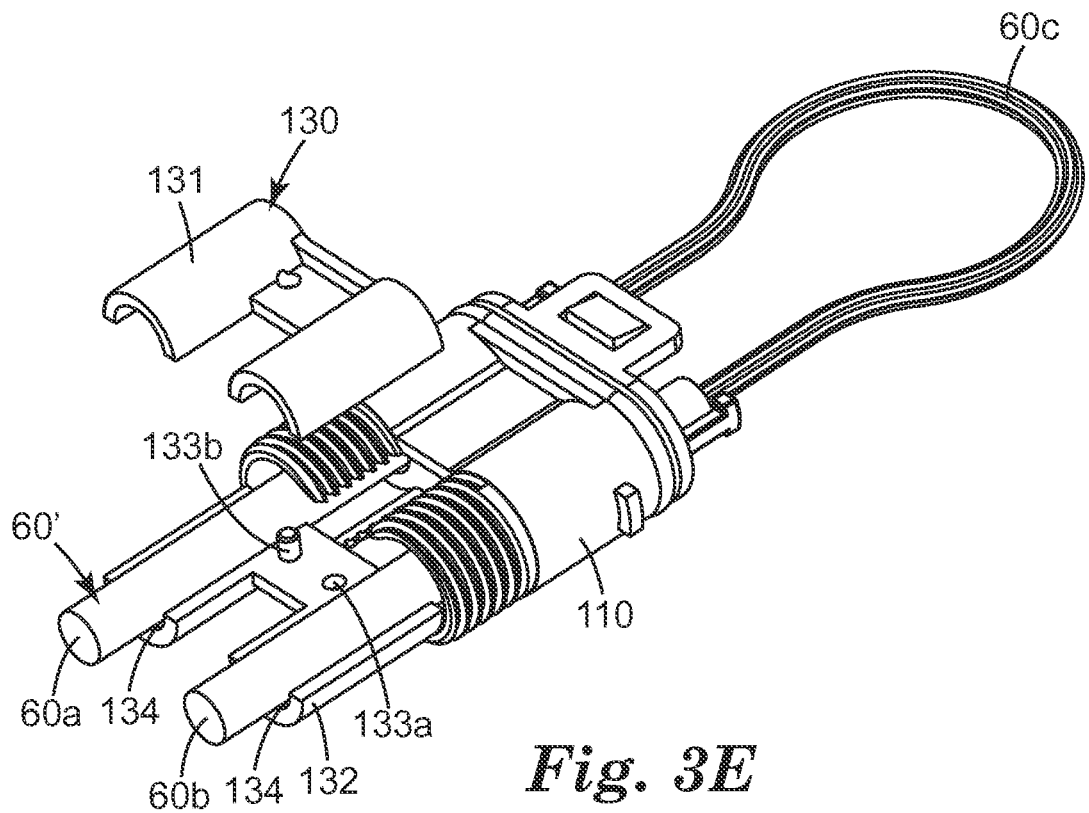
Figure 3F:
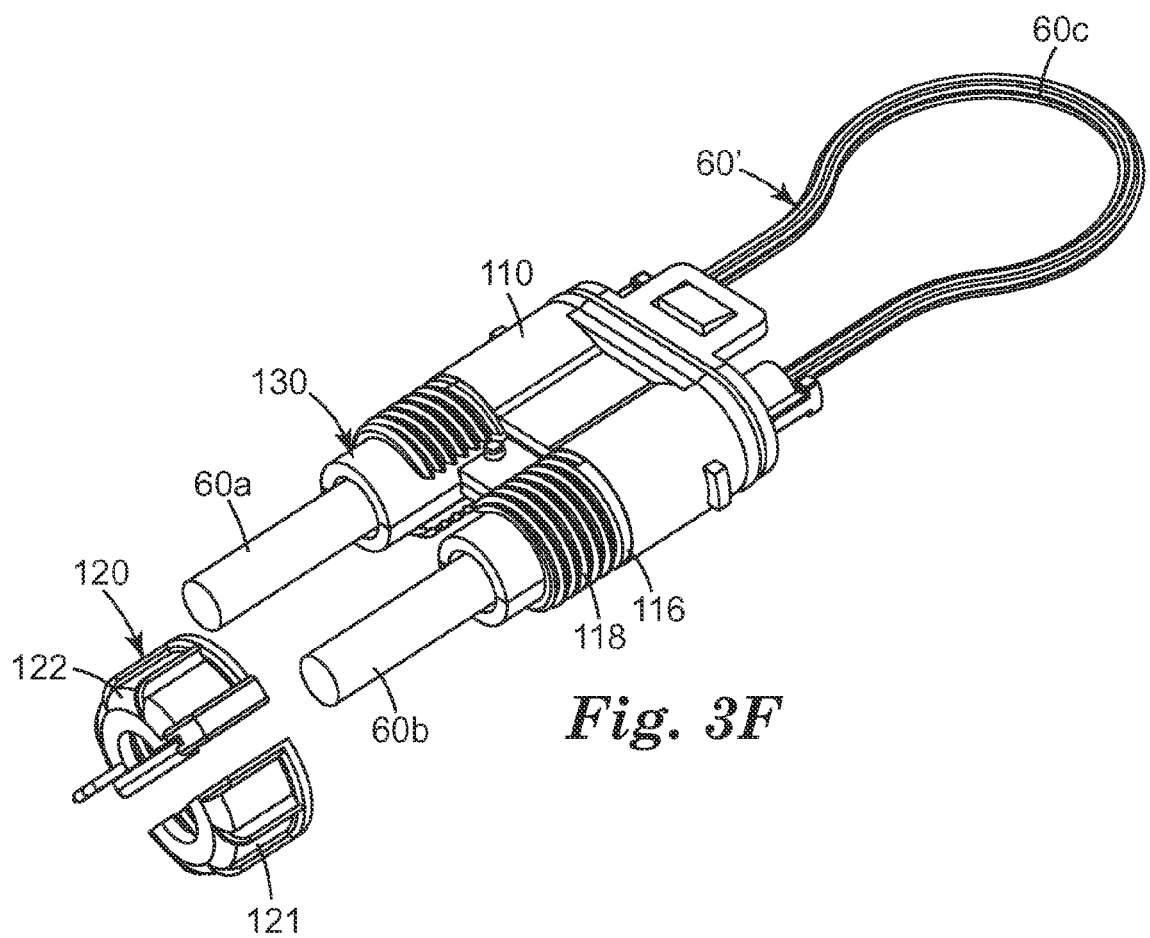
Figure 3G:
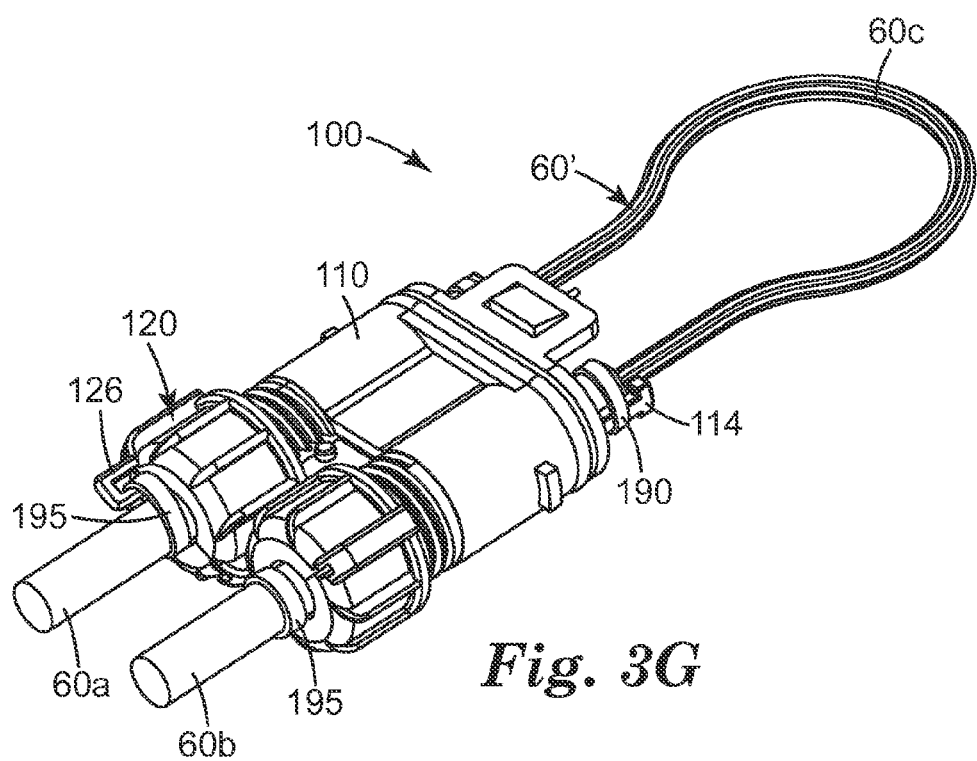

Split sleeve 130 can be placed onto end portions 60a, 60b of the optical fiber cable loop as shown in FIG. 3D. Each of the end portions 60a, 60b of optical fiber cable 60' can be placed into the troughs 134 of shell member 132. Shell member 131 can then be disposed on shell member 132 by the mating of alignment structures 133a, 133b (FIG. 3E). The split sleeve 130 can be then inserted into the housing 110 behind the internal sealing member (not shown).

Nut portions 121, 122 of clamping nut 120 are fitted together around an end portion 60a, 60b of the loop of optical fiber cable 60' (FIG. 3F) by mating the ridges and mating slots of the two nut portions 121, 122. The assembled clamping nut can then be threadably mated with external threaded portion 118 on the leg portion 116 of housing 110. The second clamping nut (not shown) can be attached to the second leg portion of the housing in a similar manner. Tightening of the clamping nuts 120 onto the housing 110 pushes the split sleeve 130 deeper into housing 110 and compresses internal sealing member 140 within the housing interior passageway 113 to form an environmental seal around the end portions of the loop of optical fiber cable. A cable tie 195 (FIG. 3G) may be inserted through loop 126 of clamping nut 120 and secured around end portions 60a or 60b of the optical fiber cable 60' and tightened in place to keep the clamping nut securely in place. Similarly, a cable tie 190 may be secured around the optical fiber cable 60' or each portion 60a, 60b of the optical fiber cable and the strain relief bracket(s) 114 on the first end 110a of the housing 110 to provide strain relief to the fiber optic cable.

Advantageously as illustrated above, the port entry device 100 may be fully assembled out side of the telecommunication enclosure. This configuration eliminates the need for the field technician to have to work in the tight confines of the telecommunication enclosure when assembling the port sealing device. After assembly, the port sealing device is simply snapped into a correspondingly shaped port on a telecommunication enclosure.

FIG. 4A shows an exemplary telecommunication enclosure 300 which may be used in conjunction with port entry device 100. Exemplary telecommunication enclosure 300 can have a bottom portion 305 and a lid 310 (FIG. 4C) which may be secured to the bottom portion 305 having a sealing gasket 335 (FIG. 4C) interposed in between. When engaged, the bottom portion 305 and the lid 310 provide protection for the internal components (e.g. telecommunication lines, splices and devices) from weather, insects and other external hazards. Telecommunication enclosure 300 can have a butt-configuration which includes one end plate 322 having ports 326, 328 there through and a second solid end plate 323 in the bottom portion. Alternatively, the telecommunication enclosure can have an in-line configuration including two end plates disposed at opposite ends of the bottom portion each of which can include a plurality of ports. Alternatively, the tubular housing of the port entry device can be integrally formed with the port of a telecommunication enclosure.

An assembled port entry device 100 can be inserted into a port 326 in end plate 322 of a telecommunication enclosure 300 as is shown in FIGS. 4A and 4B. Keying features 115 on the housing 110 of the port entry device 100 can engage with receptacles 315 on port 326 to ensure proper alignment. The port entry device 100 can be secured in place by engaging latch structures 117a with the edge 326a of the port 326.

Additionally, telecommunication enclosure 300 may have a plurality of smaller port structures 328 which can be used to allow passage of drop cables or other telecommunication cables which terminate inside of the enclosure through conventional inlet devices or preterminated drop cable assemblies. Conventional inlet devices are described in U.S. Pat. No. 6,269,214; PCT Patent Application No. PCT/US2009/037336; PCT Publication No. WO2009/067311; and PCT Patent Application No. PCT/US2009/047351, each of which is incorporated by reference herein in its entirety. Conventional preterminated drop cable assemblies are described in U.S. Publication No. 2009-0060421-A1, which is incorporated by reference herein in its entirety.

While the installation of the port entry device has been described with respect to its installation in a butt-style telecommunication enclosure system, the port entry device may be used in conjunction with other conventional telecommunication enclosure, closures, terminals, cabinets, optical network units, and other telecommunication junction boxes.

Various modifications extending the use of the port entry device to other telecommunication enclosures or other telecommunication network designs, as well as numerous structures to which the present invention may be applicable will be readily apparent to those of skill in the art to which the present invention is directed upon review of the present specification.

We claim:

1. A port entry device configured to be mounted on a communication cable, the port entry device comprising:
   a tubular housing having a interior passageway between a first end of the housing and a second end of the housing, wherein the housing has an elliptical cross section and wherein the interior passageway includes a first cable channel and a second cable channel, wherein the port entry device includes at least one strain relief bracket disposed on the first end of the housing;
   a split sleeve that is fittable around the communication cable and is removably disposed within the interior passageway of the housing, wherein the split sleeve comprises a pair of shell members, wherein each of the shell members has a pair of troughs for receiving a telecommunication cable separated by a land area disposed between the troughs to ensure proper spacing between the telecommunication cables; and
   a pair of clamping nuts attachable to the second end of the housing to secure the split sleeve within the housing.

2. The port entry device of claim 1, further comprising an internal sealing member disposed in the interior passageway in the housing between the split sleeve and the first end of the housing, wherein the communication cable passes through the internal sealing member and wherein the internal sealing member may be compressed when the clamping nuts are secured to the second end of the housing.

3. The port entry device of claim 1, further comprising an external sealing member disposed in a groove near the first end of the housing.

4. The port entry device of claim 1, wherein the port entry device is mounted on the telecommunication cable.

5. The port entry device of claim 1, wherein the communication cable is a loop of a continuous cable.

6. The port entry device of claim 1, wherein the port entry device is fitted over the terminal ends of at least two communication cables.

7. The port entry device of claim 1, further comprising a latch structure configured to secure the port entry device into a port of a telecommunications enclosure.

8. The port entry device of claim 1, wherein each clamping nut is threadably connected to a leg portion of the tubular housing.

9. The port entry device of claim 8, wherein the clamping nut comprises two intermateable nut portions.

10. The port entry device of claim 8, wherein the clamping nut comprises a strain relief device extending from the second side of the clamping nut.

11. The port entry device of claim 1, wherein the port entry device further comprises a strength member securing device to connect strength members in the telecommunication cable to the port entry device.

12. The port entry device of claim 1, wherein the port entry device is secured in a port of a telecommunication enclosure.

* * * * *